(12) United States Patent
Kurihara et al.

(10) Patent No.: US 6,613,975 B1
(45) Date of Patent: Sep. 2, 2003

(54) MEMBER FOR ASSEMBLING RADIO WAVE ABSORBER AND METHOD OF PRODUCING RADIO WAVE ABSORBER

(75) Inventors: Hiroshi Kurihara, Tokyo (JP); Toshifumi Saitoh, Tokyo (JP); Motonari Yanagawa, Tokyo (JP); Taku Murase, Tokyo (JP); Kozo Hayashi, Tokyo (JP); Kyoichi Fujimoto, Gifu (JP)

(73) Assignees: TDK Corporation, Tokyo (JP); Tokiwa Electric Co., Kakamigahara (JP)

( * ) Notice: Subject to any disclaimer, the term of this patent is extended or adjusted under 35 U.S.C. 154(b) by 0 days.

(21) Appl. No.: 09/412,780

(22) Filed: Oct. 5, 1999

(30) Foreign Application Priority Data

Oct. 5, 1998 (JP) ............................. 10-297624

(51) Int. Cl.$^7$ ............................. H05K 9/00; B23B 3/12; H01Q 17/00
(52) U.S. Cl. .................. 174/35 MS; 342/4; 428/116; 428/121; 156/71; 523/137
(58) Field of Search ................ 174/35 R, 35 C, 174/35 MS, 35 TS; 342/1, 4; 361/816; 428/116, 121; 156/60, 71, 191; 181/292, 293, 294; 523/137

(56) References Cited

U.S. PATENT DOCUMENTS

| | | | | |
|---|---|---|---|---|
| 5,594,218 A | * | 1/1997 | Diaz et al. ................ | 181/295 |
| 5,688,348 A | * | 11/1997 | Diaz et al. ................ | 156/197 |
| 6,217,978 B1 | * | 4/2001 | Murase et al. ............. | 428/116 |
| 6,344,255 B1 | * | 2/2002 | Murase et al. ............. | 428/116 |
| 6,407,693 B1 | * | 6/2002 | Murase et al. ............. | 342/4 |

FOREIGN PATENT DOCUMENTS

| | | |
|---|---|---|
| DE | 44 05 847 | 8/1995 |
| EP | 0 689 262 | 12/1995 |
| JP | 63-252500 | 10/1988 |
| JP | 2-25277 | 7/1990 |
| JP | 3-35597 | 2/1991 |
| JP | 8-67544 | 3/1996 |
| JP | 8-83992 | 3/1996 |
| JP | 9-307268 | 11/1997 |
| JP | 10-51180 | 2/1998 |
| JP | 2743227 | 2/1998 |
| JP | 2760578 | 3/1998 |
| WO | WO 93/23892 | 11/1993 |

OTHER PUBLICATIONS

U.S. patent application Ser. No. 09/412,780, filed Oct. 5, 1999, Pending.
U.S. patent application Ser. No. 09/487,613, filed Jan. 20, 2000, Pending.
U.S. patent application Ser. No. 09/453,074, filed Dec. 2, 1999, pending.
U.S. patent application Ser. No. 09/383,190, filed Aug. 26, 1999, pending.
U.S. patent application Ser. No. 09/384,383, filed Aug. 27, 1999, pending.
U.S. patent application Ser. No. 09/390,293, filed Sep. 3, 1999, pending.
U.S. patent application Ser. No. 09/412,780, Oct. 5, 1999, pending.

* cited by examiner

*Primary Examiner*—Jessica Han
(74) *Attorney, Agent, or Firm*—Oblon, Spivak, McClelland, Maier & Neustadt, P.C.

(57) ABSTRACT

A radio wave absorber-assembling member comprises an incombustible base material enabled to assemble a desired-shape structure, and radio wave-absorbent incombustible materials fixed to predetermined regions of the base material. The base material is folded at regions to which no incombustible material is fixed. Then, end portions of the base material are bonded to each other so that a radio wave absorber is obtained.

20 Claims, 18 Drawing Sheets

104

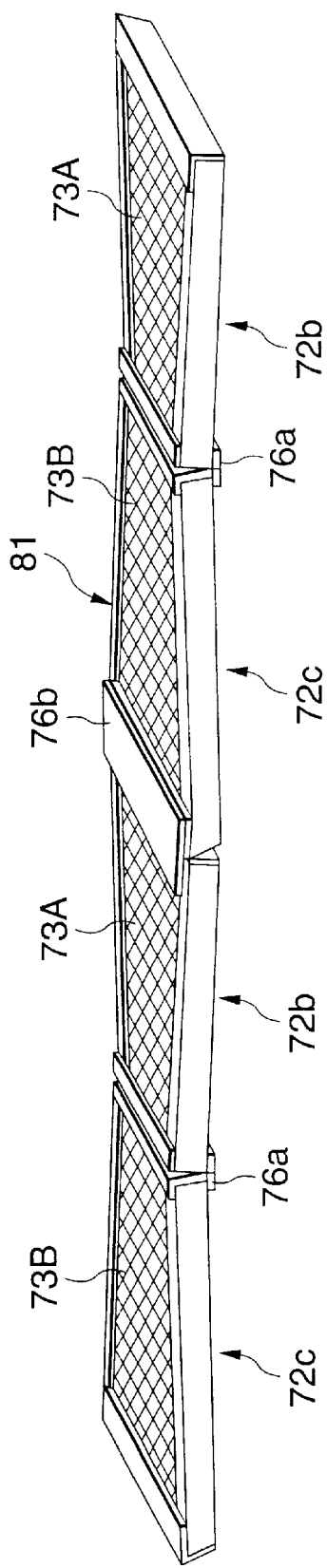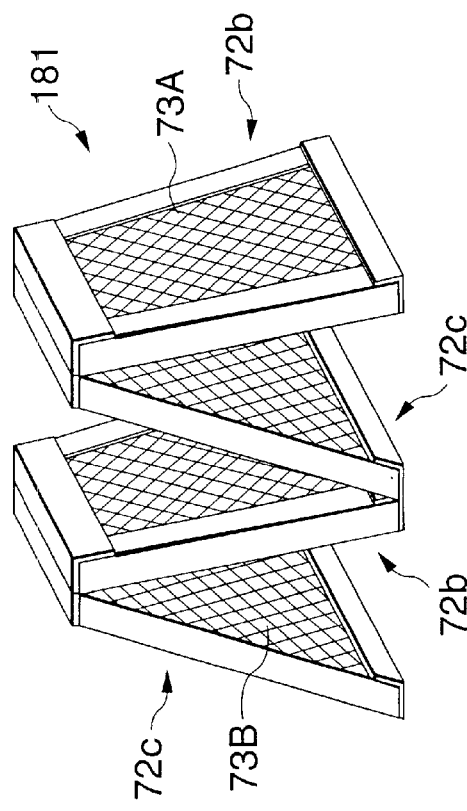

MEMBER FOR ASSEMBLING RADIO WAVE ABSORBER AND METHOD OF PRODUCING RADIO WAVE ABSORBER

BACKGROUND OF THE INVENTION

The present invention relates to a radio wave absorber used in a radio wave anechoic room.

In recent years, use of electric waves has been spread rapidly in the field of mobile communication to realize a higher-grade information oriented society. On the other hand, various electronic appliances have been popularized with the reformative advance of today's microelectronics technology. With the advance of such information communication technology, however, the influence of unnecessary electromagnetic wave noise, or the like, on apparatuses relevant to precision machinery has become a subject of discussion.

A radio wave anechoic room (radio wave dark room) having no electromagnetic wave reflection is generally used for measurement of electromagnetic wave noise. A radio wave absorber is disposed in an inner wall of such a radio wave anechoic room. Examples of the background-art radio wave absorber used in the radio wave anechoic room include radio wave absorbers made from organic materials such as foamed styrol, foamed styrene, foamed urethane, etc., mixed with carbon black, or the like, to obtain electrical conductivity. Further, the radio wave absorber is used as a stereostructure shaped into a quadrangular pyramid, a triangular prism or a wedge. For example, the radio wave absorber having such a stereostructure is generally produced by: preparatorily foaming not-yet-foamed polystyrol grains into a ball shape having a diameter of the order of millimeters; coating a surface of the ball with powder of an electrically conductive material such as carbon black, or the like; putting the ball in a desired mold; and then heating the mold to thereby secondarily foam the polystyrol grains.

On the other hand, there is proposed a method of producing a desired-shape radio wave absorber, comprising the steps of: locally heating a predetermined folding portion of an assembly member made from a radio wave-absorbent thermoplastic synthetic resin to thereby soften the folding portion; and then folding the assembly member at the folding portion (Japanese Patent No. 2760578).

The quadrangular pyramid-, triangular prism- or wedge-shaped radio wave absorber produced by a method of thermally foaming an organic material such as polystyrol, polystyrene, polyurethane, or the like, however, has a problem that not only the radio wave absorber is bulky but also the radio wave absorber is easy to break by contact, or the like, when it is carried for construction of a radio wave anechoic room.

Further, in the producing method according to Japanese Patent No. 2760578, there is a problem that the work is complicated because the step of locally heating the predetermined folding portion to thereby soften the folding portion needs to be carried out. Further, since the thermoplastic synthetic resin is used, the radio wave anechoic room for carrying out a large electric power test such as an immunity test, or the like, is inferior both in incombustible characteristic and in fire resistance. There is a problem in terms of safety.

SUMMARY OF THE INVENTION

The present invention is designed upon the aforementioned actual circumstances. The object of the present invention is to provide a method in which a desired-shape radio wave absorber excellent in working efficiency for construction of a radio wave anechoic room and having incombustible characteristic can be produced easily, and a member which can be used in the method for assembling a radio wave absorber.

In order to achieve the above object, according to the present invention, the member for assembling a radio wave absorber is configured so as to have a incombustible base material capable of assembling a predetermined-shape structure, and radio wave absorbent incombustible materials fixed to predetermined regions of the base material.

Further, the member for assembling a radio wave absorber according to the invention is configured so that the base material has folding groove portions in regions in which the incombustible materials are not fixed.

Further, the member for assembling a radio wave absorber according to the invention is configured so that the base material is constituted by a connected body which is formed by joining a plurality of base material parts to one another by foldable joint members in regions in which the incombustible materials are not fixed.

Further, the member for assembling a radio wave absorber according to the invention is configured so that each of the incombustible materials is constituted by a honey-comb structure which is formed by making incombustible sheets from a slurry containing a water-containing inorganic compound and an electrically conductive material and laminating the incombustible sheets into a honey-comb shape by use of an inorganic adhesive agent.

Further, the member for assembling a radio wave absorber according to the invention is configured so that each of the incombustible materials has a surface constituted by an electrically conductive layer containing an electrically conductive material.

The method of producing a radio wave absorber according to the present invention is configured so as to comprise the steps of: processing a incombustible base material into a shape capable of assembling a desired-shape structure; fixing radio waveabsorbent incombustible materials to predetermined regions of the base material to thereby produce a member for assembling a radio wave absorber; and bonding end portions of the base material to each other while folding the base material in regions in which the incombustible materials are not fixed.

The method of producing a radio wave absorber according to the present invention is configured so as to comprise the steps of: forming a plurality of parts each by fixing a radio wave absorbent incombustible material to a predetermined region of a incombustible base material processed into a desired shape; joining the parts to one another by foldable joint members directly or through a incombustible base material free from incombustible materials to thereby produce a member for assembling a radio wave absorber; and bonding end portions of the base material to each other while folding the joint members.

Further, the method of producing a radio wave absorber according to the invention is configured so that the shape of the radio wave absorber is any one of shapes including a quadrangular pyramid shape, a triangular prism shape, and a wedge shape.

Further, the method of producing a radio wave absorber according to the invention is configured so that folding groove portions are formed in regions of the base material free from the incombustible materials in advance so that the base material is folded in the groove portions.

In the present invention, the member for assembling a radio wave absorber is not bulky and easy to handle because it has a flat shape. Further, when a desired structure is produced by folding the incombustible base material of the radio wave absorber-assembling member or when a desired structure is produced by folding the radio wave absorber-assembling member by the bonding member, a radio wave absorber having the radio wave-absorbent incombustible material fixed to a predetermined region of the structure can be obtained.

BRIEF DESCRIPTION OF THE DRAWINGS

FIG. 2A shows a state before the fixation, FIG. 2B shows a state after the fixation;

FIG. 6A is a perspective view of a reinforcing member, FIG. 6B is a perspective view showing a state in which the radio wave absorber is reinforced by such reinforcing members;

FIG. 7A is a perspective view of a reinforcing member, FIG. 7B is a perspective view showing a state in which the radio wave absorber is reinforced by such reinforcing members;

FIG. 8A is a perspective view of a reinforcing member, FIG. 8B is a perspective view showing a state in which the radio wave absorber is reinforced by such a reinforcing member;

FIG. 9A shows the radio wave absorber-assembling member, FIG. 9B shows the radio wave absorber.

FIG. 11A shows the radio wave absorber-assembling member, FIG. 11B shows the radio wave absorber;

FIG. 12A shows the radio wave absorber-assembling member, FIG. 12B shows the radio wave absorber;

FIG. 13A is a perspective view showing the radio wave absorber-assembling member, FIG. 13B is a sectional view taken along the line A—A in FIG. 13A, FIG. 13C is a perspective view showing the radio wave absorber;

FIGS. 14A and 14B are perspective views showing the radio wave absorber-assembling member, FIG. 14C is a sectional view taken along the line B—B in FIG. 14B, FIG. 14D is a perspective view showing the radio wave absorber;

FIGS. 15A and 15B are perspective views showing the radio wave absorber-assembling member, FIG. 15C is a sectional view taken along the line C—C in FIG. 15B, FIG. 15D is a perspective view showing the radio wave absorber;

FIG. 16A shows the radio wave absorber-assembling member, FIG. 16B shows the radio wave absorber;

FIGS. 18A and 18B are perspective views showing radio wave absorber-assembling member and a radio wave absorber produced by use of this member, as a further embodiment of the present invention, FIG. 18A shows the radio wave absorber assembling member, FIG. 18B shows the radio wave absorber.

DETAILED DESCRIPTION OF THE PREFERRED EMBODIMENTS

Embodiments of the present invention will be described below.

First Embodiment

Figure 1A:
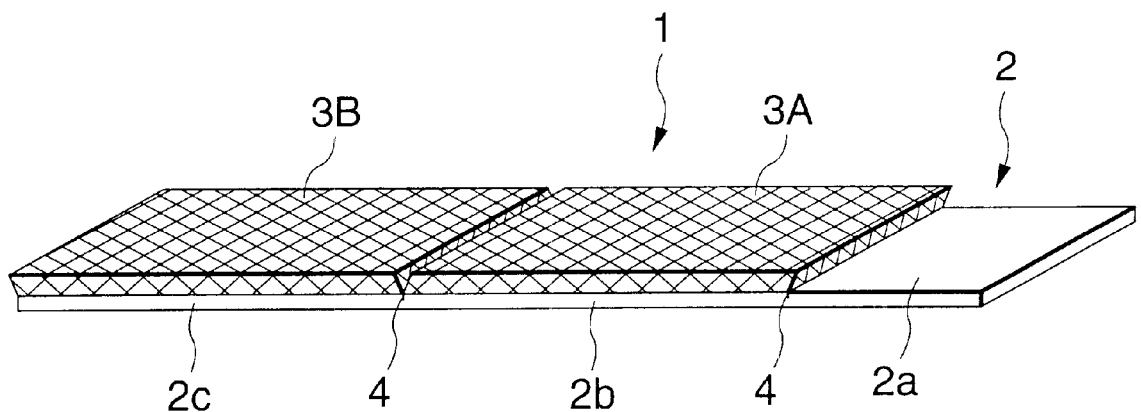
FIGS. 1A and 1B are perspective views showing a radio wave absorber-assembling member and a radio wave absorber produced by use of this member, as an embodiment of the present invention.
Figure 1B:
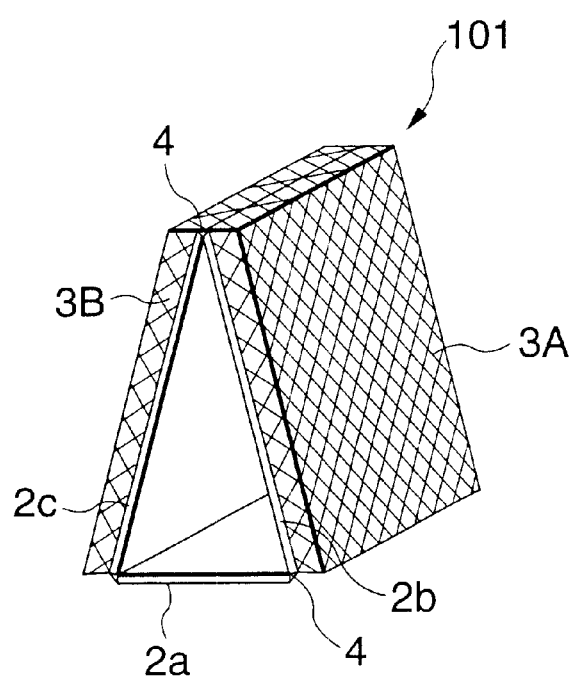

FIGS. 1A and 1B are perspective views showing a member for assembling a radio wave absorber according to the present invention and a radio wave absorber produced by use of the member, as an embodiment of the present invention. In FIG. 1A, the member 1 for assembling a radio wave absorber has a incombustible base material 2, and radio wave-absorbent incombustible materials 3A and 3B fixed onto the base material 2. The terminology "incombustible" used in the present invention means a property of a material which can pass the constructional material testing method (Notification No. 1828 of the Ministry of Construction) in which the material is judged as an incombustible one if the rise of the furnace temperature is lower than 50° C. when the material is left in a furnace at 750° C. for 20 minutes. The terminology "radio wave absorbent" means the property of a material which has a value of reflectivity not larger than about −20 dB.

Figure 2A:
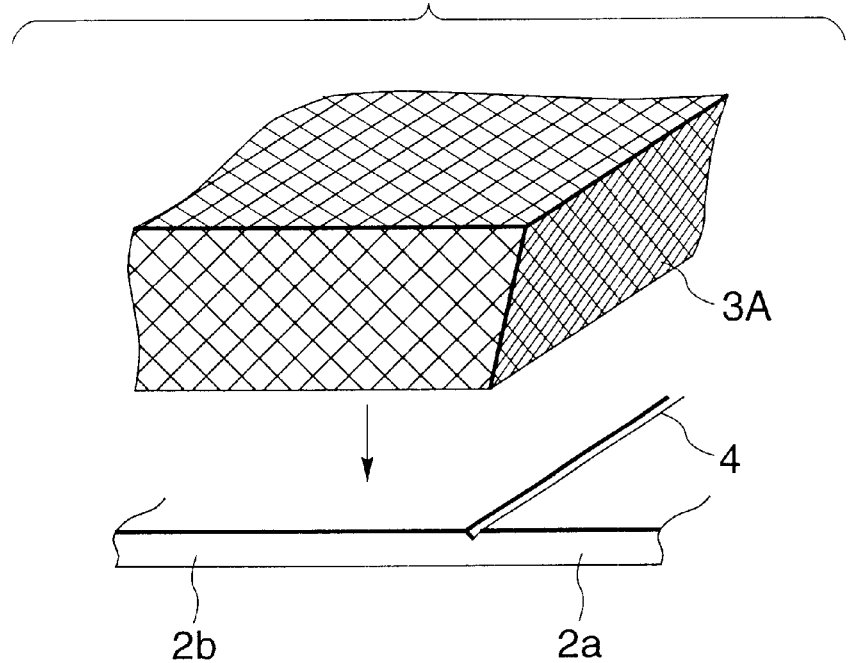
FIGS. 2A and 2B are partly perspective views for explaining fixation of a incombustible material onto a incombustible base material in which a groove portion is provided in advance.
Figure 2B:
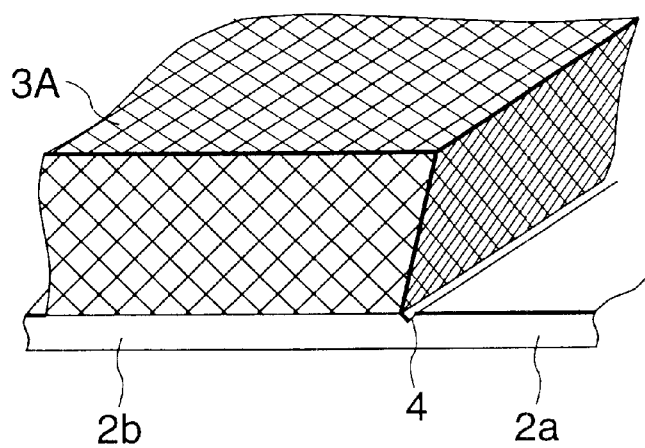

The base material 2 has a region 2a in which no incombustible material is provided, and regions 2b and 2c in which the incombustible materials 3A and 3B are fixed. Folding groove portions 4 are provided in the boundary between the regions 2a and 2b and in the boundary between the regions 2b and 2c, respectively. When the base material 2 is folded at the aforementioned groove portions 4, a wedge-shaped structure can be assembled. FIGS. 2A and 2B are partly perspective views for explaining fixation of the incombustible material 3A onto the base material 2. The base material 2 having the groove portion 4 provided in advance is prepared as shown in FIG. 2A. The incombustible material 3A is fixed onto the region 2b of the base material 2 so that an end portion of the incombustible material 3A coincides with an end portion of the groove portion 4 (FIG. 2B). An adhesive agent, such as Portland cement, gypsum, or the like, which is hardened by hydration or an inorganic adhesive agent such as phosphoric acid salt, silica sol, a water-glass composition, or the like, can be used for fixation of the incombustible material onto the base material.

Examples of the incombustible base material 2 as one of constituent parts of the radio wave absorber-assembling member 1 include: a molded body made from ceramic fiber nonwoven fabric; a molded body made from glass fiber nonwoven fabric; a calcium silicate board; a calcium carbonate foam board; a sheet of incombustible paper; a pressure-molded body of a laminate formed by bonding sheets of incombustible paper to one another through an inorganic adhesive agent; and so on. Of these, a pressure-molded body of a laminate formed by bonding sheets of incombustible paper to one another through an inorganic adhesive agent is particularly preferable in terms of facilitation of formation of the groove portion 4 at a folding position, facilitation of folding work, durability of the base material 2 in the folding work, and so on.

Figure 3:
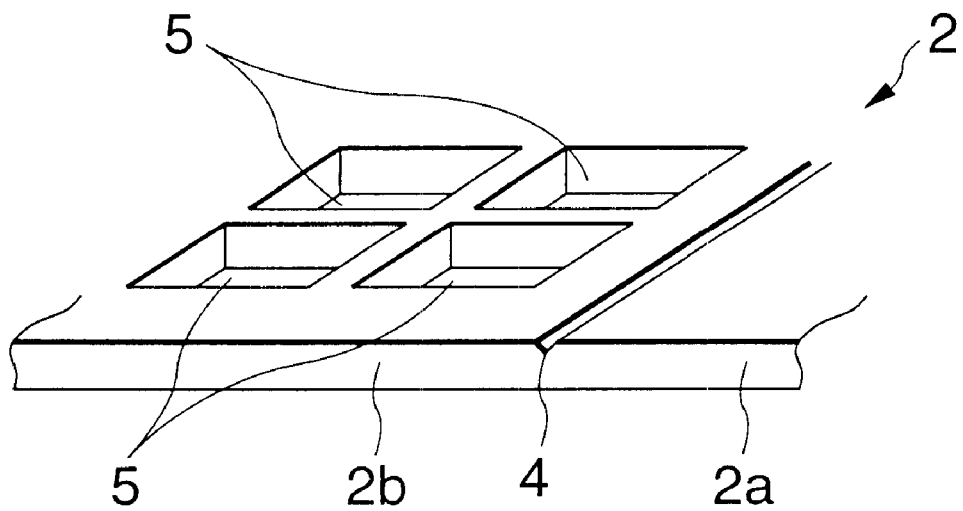
FIG. 3 is a perspective view showing another example of the incombustible base material which constitutes a radio wave absorber-assembling member according to the present invention.

Further, in the present invention, an opening portion may be provided in the incombustible base material 2 for the purposes of reduction of weight and improvement of heat radiation so long as the mechanical strength of the base material 2 becomes no issue in practical use. FIG. 3 is a partly perspective view showing an example of such a incombustible base material 2 in which a plurality of opening portions 5 are provided in the region 2b to which the incombustible material 3A is fixed. The shape, position, number, etc. of opening portions 5 can be set suitably in consideration of the mechanical strength of the base material 2.

Figure 4:
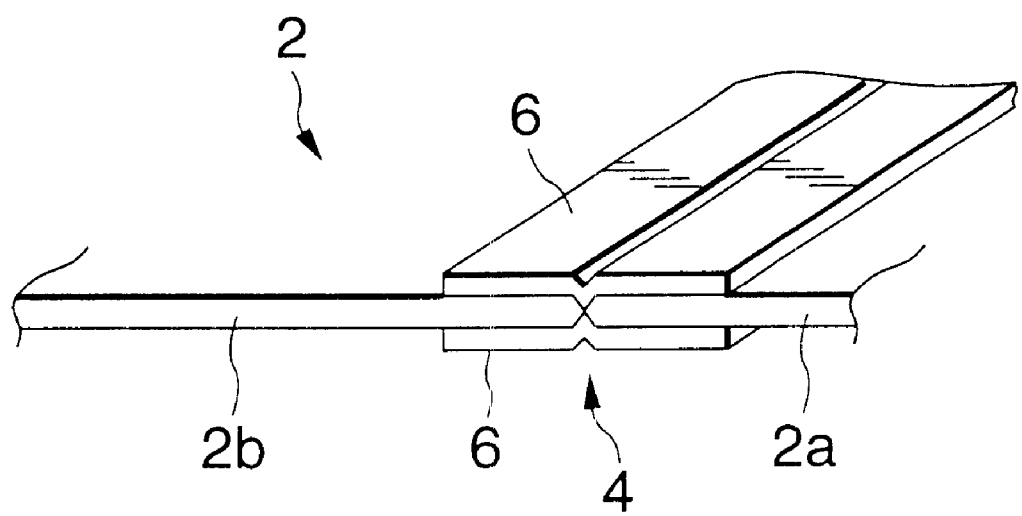
FIG. 4 is a perspective view showing an example of formation of a folding groove portion in the incombustible base material.

Any method, such as a method of pressing a sectionally-V-shaped mold, a method of cutting the incombustible base material by a rotary knife, or the like, may be used for formation of the aforementioned folding groove portion 4 in the incombustible base material 2. As for the number of groove portions 4 to be formed, a line may be formed in a place as shown in FIG. 4 or a plurality of parallel lines may be formed in a place. Alternatively, as shown in FIG. 4, grooved joint members 6 may be fixed to a butt-joint portion between base material parts (regions) 2a and 2b which are constituent parts of the base material 2. A material formed by molding flame-resistant fiber, glass fiber, or the like, by use of an inorganic adhesive agent can be used as each of the grooved bonding members 6. Although FIG. 4 shows the case where a pair of grooved joint members 6 are bonded to opposite surfaces of the base material 2 respectively, a grooved joint member 6 may be bonded to only one surface in accordance with the position of fixation of the incombustible material, and so on.

The thickness of the aforementioned incombustible base material 2 can be set to be in a range of from about 0.3 to about 10 mm and the depth of the folding groove portion 4 can be set to be in a range of from about 0.1 to about 6 mm. Preferably, the thickness of the incombustible base material 2 is in a range of from about 0.5 to about 3 mm and the depth of the folding groove portion 4 is in a range of from about 0.1 to about 1 mm.

The radio wave-absorbent incombustible materials 3A and 3B as constituent parts of the radio wave absorber-assembling member 1 are formed so that the surfaces of the incombustible materials 3A and 3B fixed to the base material 2 have substantially the same shapes as those of the regions 2b and 2c of the base material 2. Examples of a material which can be used as each of the incombustible materials 3A and 3B, include: a radio wave absorber produced by integrally bonding a large number of closed-cell inorganic grains to one another by an inorganic adhesive agent containing an electrically conductive material dispersively (Japanese Patent No. 2743227); a radio wave absorber produced by sticking and fixing an electrically conductive material to a molded body of ceramic short fiber or glass short fiber having a specific aspect ratio by penetration and impregnation (JP-A-9-307268); a radio wave absorber made from a composition containing cement, light weight aggregate, electrically nonconductive fiber, synthetic resin emulsion, and an electrically conductive material (JP-A-8-67544); a radio wave absorber made from a incombustible honey-comb structure formed by laminating incombustible sheets each made from a slurry containing a water-containing inorganic compound and an electrically conductive material into a honey-comb shape by use of an inorganic adhesive agent; and so on. Of these, an incombustible honeycomb structure is preferable in terms of radio wave absorbing characteristic, light-weight characteristic, incombustible characteristic, mechanical strength and heat radiation.

Carbon black, graphite, carbon fiber, or the like, can be used as the aforementioned electrically conductive material. Silastic balloons, silica balloons, glass beads, perlite, alumina-silica balloons, or the like, can be used as the closed-cell inorganic grains. Further, examples of the inorganic adhesive agent which can be used, include: adhesive agents, such as Portland cement, gypsum, etc., which is hardened by hydration; and inorganic adhesive agents such as phosphoric acid salt, silica sol, a water-glass composition, etc.; and so on. Especially, a water-glass composition can be used preferably because it is inexpensive and high in cementing characteristic. Water-glass is an aqueous solution containing alkaline metal silicate as a main component. Especially, sodium silicate is preferable because it is inexpensive and easily available as an article standardized according to JIS. Further, a mixture of water-glass of sodium silicate and water-glass of lithium silicate may be used.

A honey-comb structure as each of the incombustible materials 3A and 3B is produced as follows. First, a required number of incombustible sheets each having a predetermined width are prepared and an inorganic adhesive agent is applied like stripes on each of the incombustible sheets at predetermined intervals in a longitudinal direction of the incombustible sheets. The incombustible sheets are laminated in a manner so that the position of stripe-like application of the inorganic adhesive agent is shifted by a half pitch between adjacent ones of the incombustible sheets. Then, the laminate is pressed so as to be adhesively bonded at the position of application of the inorganic adhesive agent so that a sheet block is formed. Here, the width of application of the inorganic adhesive agent is equal to the size of length of joint surfaces of cells in the honey-comb structure.

Accordingly, cell size can be controlled by adjusting the width and formation interval of the inorganic adhesive agent layers. Then, the sheet block is cut into a required honey-comb structure thickness and spread while being immersed in an inorganic impregnant. In a spread state required for forming cells, the inorganic impregnant is dried and solidified as an inorganic impregnant layer so that a honey-comb structure is obtained. For example, a water-soluble or water-dispersed type material formed by mixing a curing agent, a catalyst, etc. with an aluminum phosphate solution, colloidal silica, colloidal alumina, or the like, can be used as the inorganic adhesive agent. Although any one of various types of inorganic adhesive agents can be used as the inorganic impregnant, the same material as the inorganic adhesive agent for bonding the incombustible sheets is preferably used as the inorganic impregnant.

The thickness of each of the incombustible materials 3A and 3B can be set to be in a range of from about 5 to about 40 mm, preferably in a range of from 10 to 30 mm.

In the present invention, each of the incombustible materials 3A and 3B may be coated with an electrically conductive layer containing an electrically conductive material. For example, the electrically conductive layer can be formed by: an immersion method in which an electrically conductive coating composition containing an electrically conductive material dispersed in an inorganic binder is prepared and an incombustible material such as a honey-comb structure, or the like, is immersed in the electrically conductive coating composition and lifted up so that an electrically conductive layer is formed on a surface of the incombustible material; an application method in which the aforementioned electrically conductive coating composition is applied on the incombustible material by use of a brush, or the like, to thereby form an electrically conductive layer; a method in which the aforementioned electrically conductive coating composition is sprayed onto the incombustible material by use of a spray, or the like, so that an electrically conductive layer is formed; or the like. Among the aforementioned forming methods, the immersion method and the application method are particularly referable. The electrically conductive material to be used is not limited specifically so long as the material has electrically conductive characteristic. For example, carbon black, graphite, carbon fiber, or the like, can be used as the electrically conductive material. Although a water-glass type binder, a silica-alumina type binder, or the like, can be used as the inorganic binder, the inorganic binder is not limited to these materials.

In the present invention, an inorganic coating film made from water-glass, or the like, may be further formed on the aforementioned electrically conductive layer. By the provision of the inorganic coating film, not only both tensile strength and compressive strength of an incombustible material, especially of a honey-comb structure, can be enhanced but also the spread state of the honey-comb structure can be held more stably.

The method of producing a radio wave absorber according to the present invention has the steps of: folding the aforementioned radio wave absorber-assembling member 1 at groove portions 4 (regions to which the radio wave-absorbent incombustible materials 3A and 3B are not fixed) of the base material 2 so as to assemble a wedge-shaped structure having the incombustible materials 3A and 3B located outward and having the region 2a of the base material 2 as its base; and bonding an end portion of the region 2a of the base material 2 to an end portion of the region 2c of the base material 2 to thereby obtain a radio wave absorber 101 (FIG. 1B).

With respect to the folding of the base material 2 in regions in which the radio wave-absorbent incombustible materials 3A and 3B are not fixed, a member such as a batten may be disposed along the folding position so that the base material 2 can be folded in the case where no groove portion 4 is formed.

Bonding of an end portion of the region 2a of the base material 2 to an end portion of the region 2c of the base material 2 is not limited specifically. FIGS. 5A to 5D are views showing examples of bonding of end portions of the base material. In the example shown in FIG. 5A, an end portion of the region 2a and an end portion of the region 2c are bonded to each other by an inorganic adhesive agent. Examples of the inorganic adhesive agent to be used are the aforementioned inorganic adhesive agents.

Figure 5A:
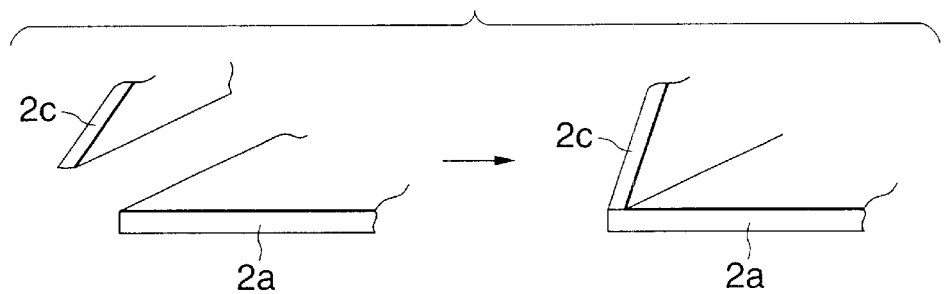
FIGS. 5A to 5D are views showing examples of bonding end portions of the incombustible base material in a producing method according to the present invention.
Figure 5B:
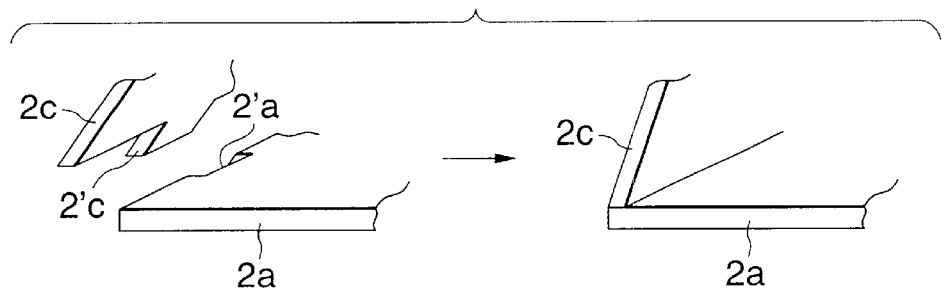

In the example shown in FIG. 5B, a fitting cut-out portion 2'a and a fitting protrusive portion 2'c are provided in end portions of the regions 2a and 2c respectively so that the protrusive portion 2'c is fitted into the cut-out portion 2'a and fixed and bonded to the cut-out portion 2'a by an inorganic adhesive agent.

Figure 5C:
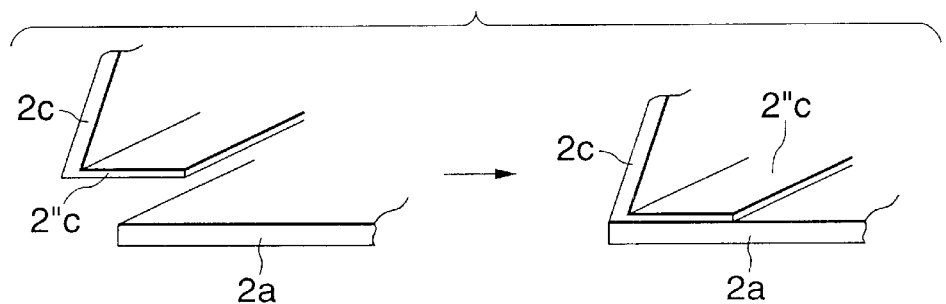
Figure 5D:
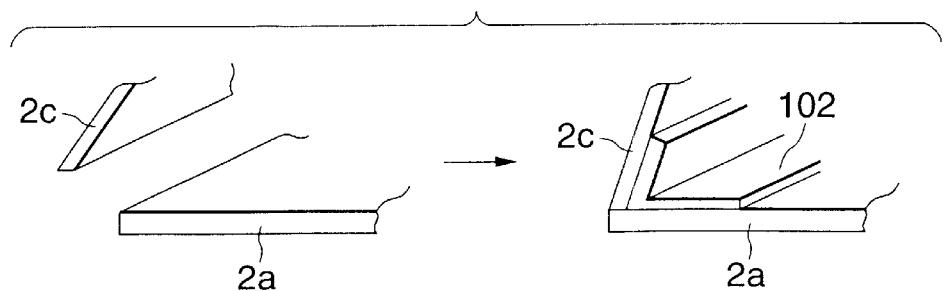

In the example shown in FIG. 5C, a bonding flange 2"c is provided in an end portion of the region 2c so that the flange 2"c is adhesively bonded to a neighbor of an end portion of the region 2a by an inorganic adhesive agent. Further, in the example shown in FIG. 5D, a neighbor of an end portion of the region 2a and a neighbor of an end portion of the region 2c are bonded to a wedge-shaped joint member 102 by an inorganic adhesive agent.

Figure 6A:
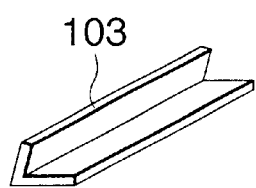
FIGS. 6A and 6B are views for explaining reinforcement of the radio wave absorber assembled in the producing method according to the present invention.
Figure 6B:
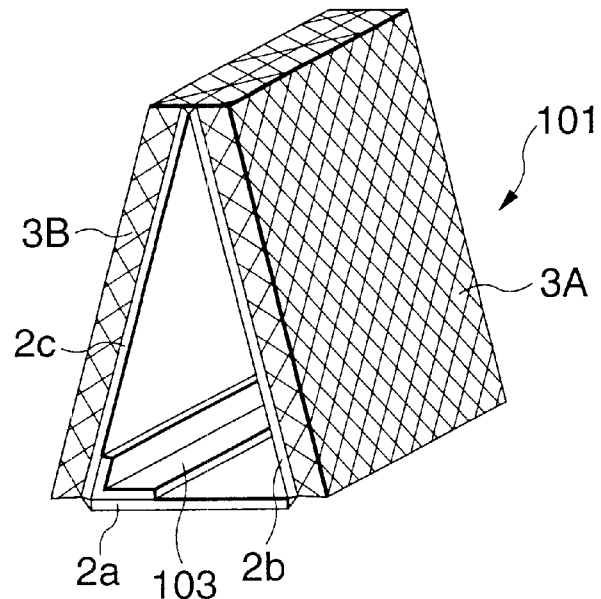

Further, in the method of producing a radio wave absorber according to the present invention, a reinforcing member may be used for reinforcing the radio wave absorber assembled by folding the radio wave absorber-assembling member 1. FIGS. 6 to 8 are perspective views showing examples of use of the reinforcing member. In the example shown in FIGS. 6A and 6B, wedge-shaped reinforcing members 103 are bonded to a joint portion between an end portion of the region 2a and an end portion of the region 2c and to a folding portion between an end portion of the region 2a and an end portion of the region 2b by an inorganic adhesive agent.

Figure 7A:
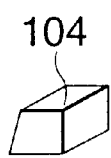
FIGS. 7A and 7B are views for explaining reinforcement of the radio wave absorber assembled in the producing method according to the present invention.
Figure 7B:
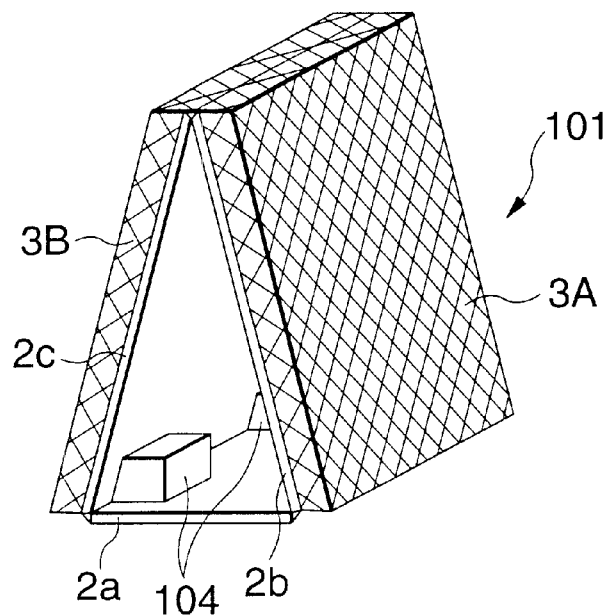
Figure 8A:
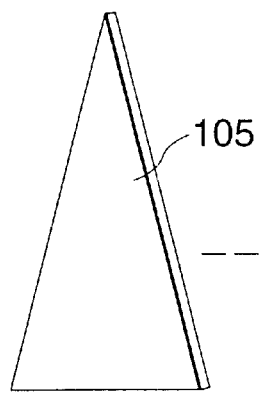
FIGS. 8A and 8B are views for explaining reinforcement of the radio wave absorber assembled in the producing method according to the present invention.
Figure 8B:
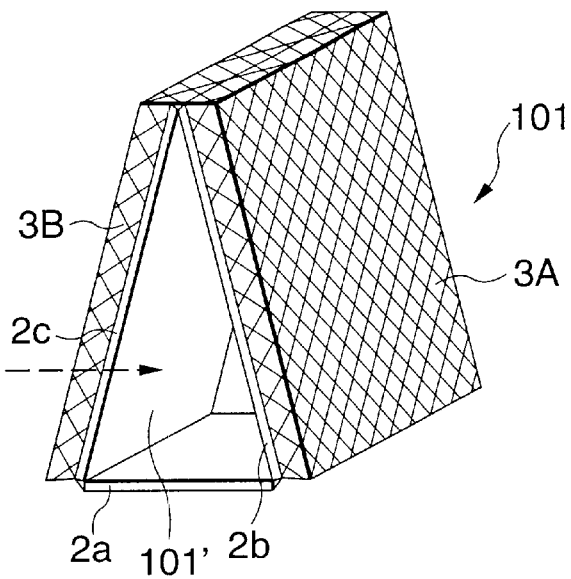

Further, in the example shown in FIGS. 7A and 7B, reinforcing members 104 each shaped like a prism having a trapezoidal section are bonded to a joint portion between an end portion of the region 2a and an end portion of the region 2c and to a folding portion between an end portion of the region 2a and an end portion of the region 2b by an inorganic adhesive agent. Further, in the example shown in FIGS. 8A and 8B, a reinforcing member 105 having the same shape as a triangular opening portion 101' of the radio wave absorber 101, which is a wedge-shaped structure, is fitted and bonded to the opening portion 101' by an inorganic adhesive agent.

Second Embodiment

Figure 9A:
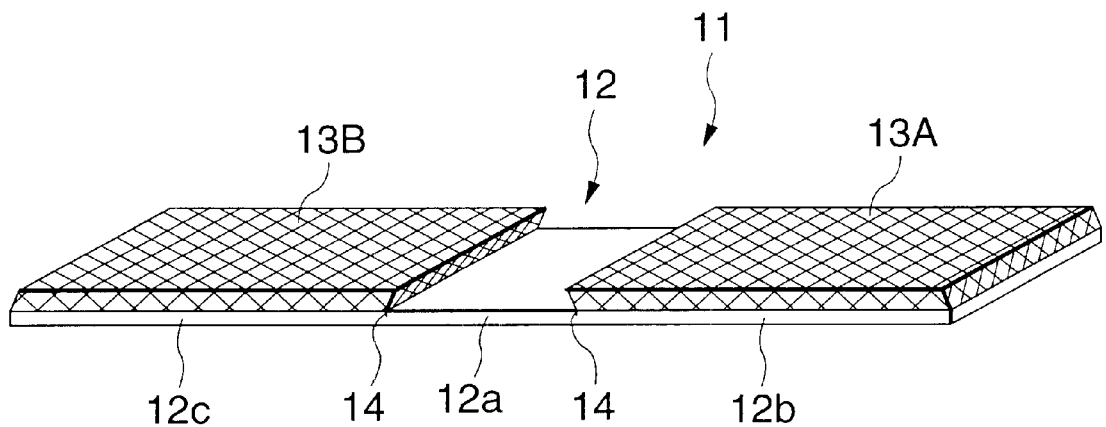
FIGS. 9A and 9B are perspective views showing a radio wave absorber-assembling member and a radio wave absorber produced by use of this member, as another embodiment of the present invention.
Figure 9B:
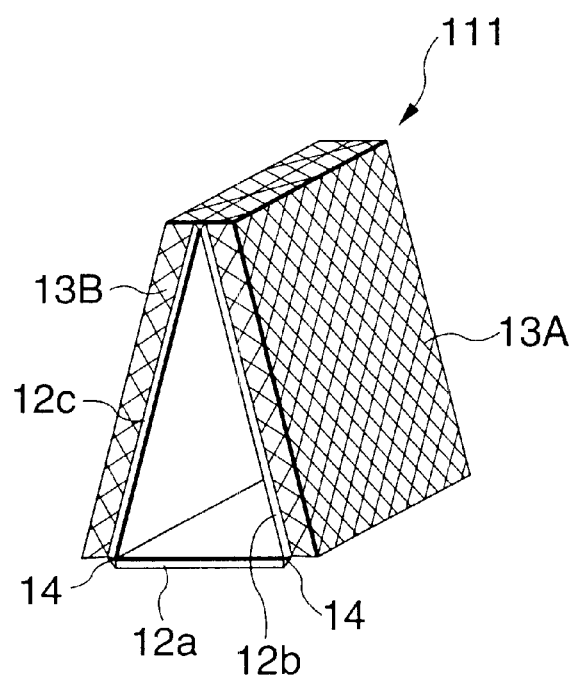

FIGS. 9A and 9B are perspective views showing a radio wave absorber-assembling member and a radio wave absorber produced by use of this member, as another embodiment of the present invention. In FIG. 9A, the radio wave absorber-assembling member 11 has an incombustible base material 12, and radio wave-absorbent incombustible materials 13A and 13B fixed onto the base material 12. The base material 12 has a region 12a in which no incombustible material is provided, and regions 12b and 12c in which the incombustible materials 13A and 13B are fixed respectively. Folding groove portions 14 are provided in the boundary between the regions 12a and 12b and the boundary between the regions 12a and 12c respectively. A wedge-shaped structure can be assembled by folding the base material 12 at the aforementioned groove portions 14. Incidentally, the quality, thickness, etc. of the base material 12 and those of the incombustible materials 13A and 13B can be set in the same manner as in the aforementioned radio wave absorber-assembling member 1 and the description thereof will be omitted.

In this embodiment, the aforementioned radio wave absorber-assembling member 11 is folded at the groove portions 14 (regions in which the radio wave-absorbent incombustible materials 13A and 13B are not fixed) of the base material 12 so that there is assembled a wedge-shaped structure having the incombustible materials 13A and 13B located outward and having the region 12a of the base material 12 as its base. Then, an end portion of the region 12b of the base material 12 and an end portion of the region 12c of the base material 12 which are located in a top end portion of the wedge-shaped structure, are bonded to each other so that a radio wave absorber 111 is obtained (FIG. 9B).

Figure 10A:
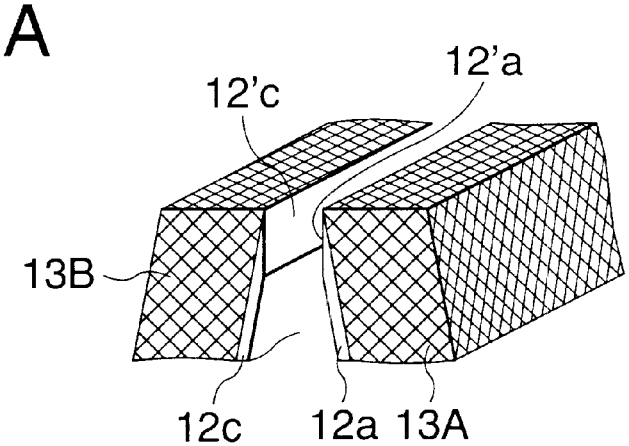
FIGS. 10A to 10C are views showing an example of bonding end portions of the base material in the producing method according to the present invention.
Figure 10B:
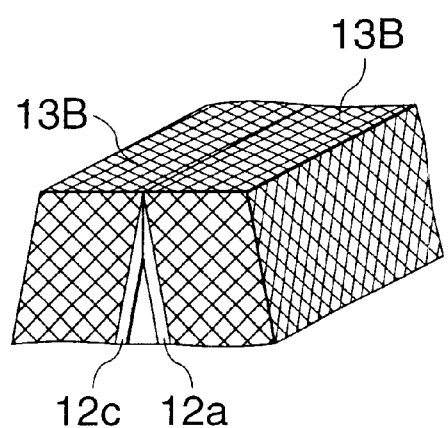
Figure 10C:
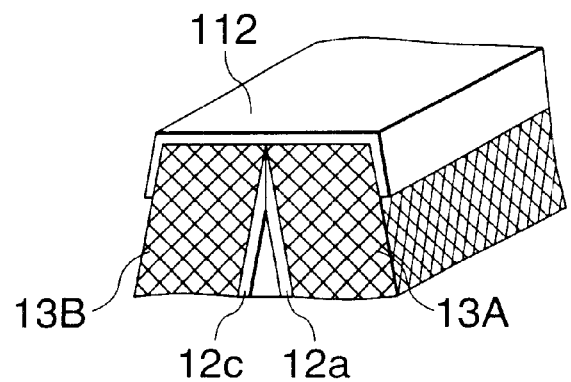

Any one of the methods shown in FIGS. 5A to 5D may be used without specific limitation for bonding an end portion of the region 12b of the base material 12 to an end portion of the region 12c of the base material 12. Alternatively, as shown in FIGS. 10A to 10C, for example, both an end portion of the region 12b and an end portion of the region 12c are cut out obliquely to form butt-contact surfaces 12'b and 12'c in advance (FIG. 10A) so that the end portions of the regions 12b and 12c may be bonded to each other by bringing the butt-contact surfaces 12'b and 12'c into contact with each other (FIG. 10B) and by bonding a stoppage member 112 to a top end portion of the wedge-shaped structure by an inorganic adhesive agent (FIG. 10C). Examples of the inorganic adhesive agent to be used include the aforementioned inorganic adhesive agents. Further, a material molded from fire-resistant fiber, glass fiber, or the like, by use of an inorganic adhesive agent can be used as the stoppage member 112.

Third Embodiment

Figure 11A:
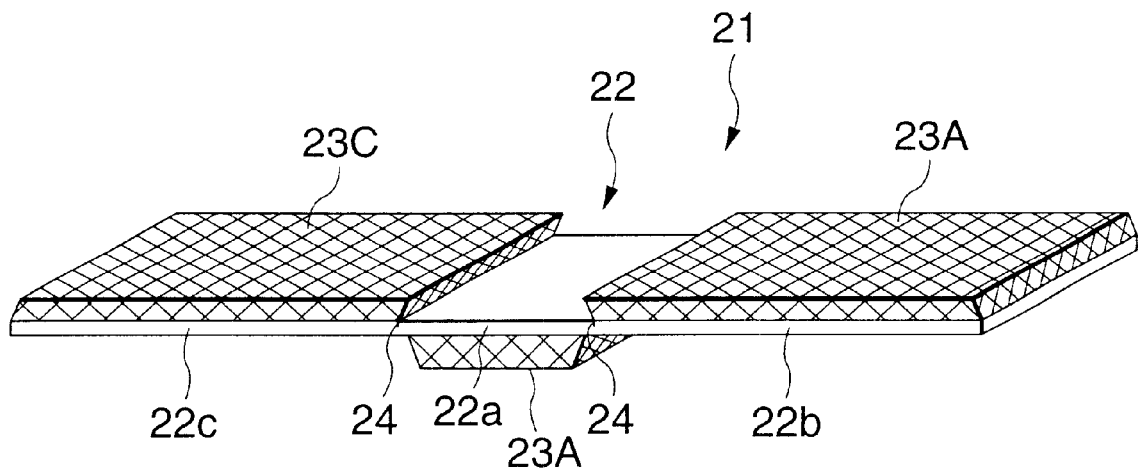
FIGS. 11A and 11B are perspective views showing a radio wave absorber-assembling member and a radio wave absorber produced by use of this member, as a further embodiment of the present invention.
Figure 11B:
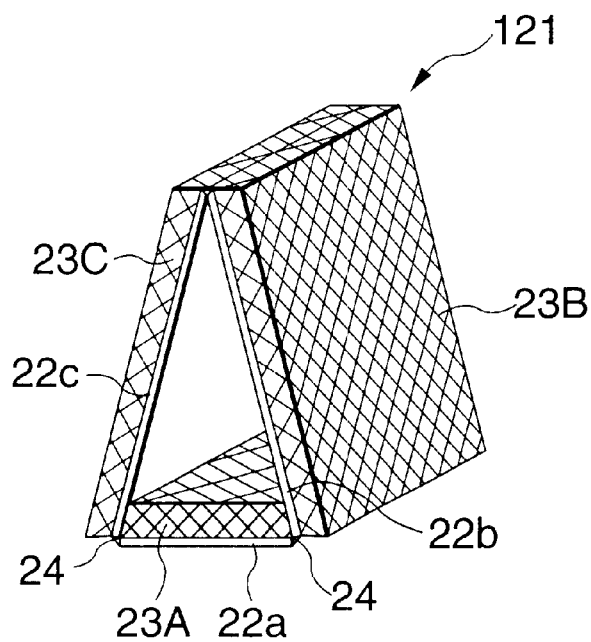

FIGS. 11A and 11B are perspective views showing a radio wave absorber-assembling member and a radio wave absorber produced by use of this member, as a further embodiment of the present invention. In FIG. 11A, the radio wave absorber-assembling member 21 has an incombustible basematerial 22, a radio wave-absorbent incombustible material 23A fixed onto one surface of the base material 22, and radio wave-absorbent incombustible materials 23B and 23C fixed onto the other surface of the base material 22. In the base material 22, folding groove portions 24 are provided in the boundary between a region 22a in which the incombustible material 22A is fixed and a region 22b in which the incombustible material 23B is fixed and in the boundary between the region 22a and a region 22c in which the incombustible material 23C is fixed, respectively. A wedge-shaped structure can be assembled by folding the base material 22 at the aforementioned groove portions 24. Incidentally, the quality, thickness, etc. of the base material 22 and those of the incombustible materials 23A, 23B and 23C can be set in the same manner as in the aforementioned radio wave absorber-assembling member 1 and the description thereof will be omitted.

In this embodiment, the aforementioned radio wave absorber-assembling member 21 is folded at the groove portions 24 (regions in which the radio wave-absorbent incombustible materials 23A, 23B and 23C are not fixed) of the base material 22 so that there is assembled a wedge-shaped structure having the incombustible materials 23B and 23C located outward and the incombustible material 23A located inward and having the region 22a of the base material 22 as its base. Then, an end portion of the region 22b of the base material 22 and an end portion of the region 22c of the base material 22 which are located in a top end portion of the wedge-shaped structure, are bonded to each other so that a radio wave absorber 121 is obtained (FIG. 11B). The bonding of an end portion of the region 22b of the base material 22 to an end portion of the region 22c of the base material 22 is not limited specifically but can be performed in the same manner as in the production of the radio wave absorber 111 using the aforementioned radio wave absorber-assembling member 11.

Fourth Embodiment

Figure 12A:
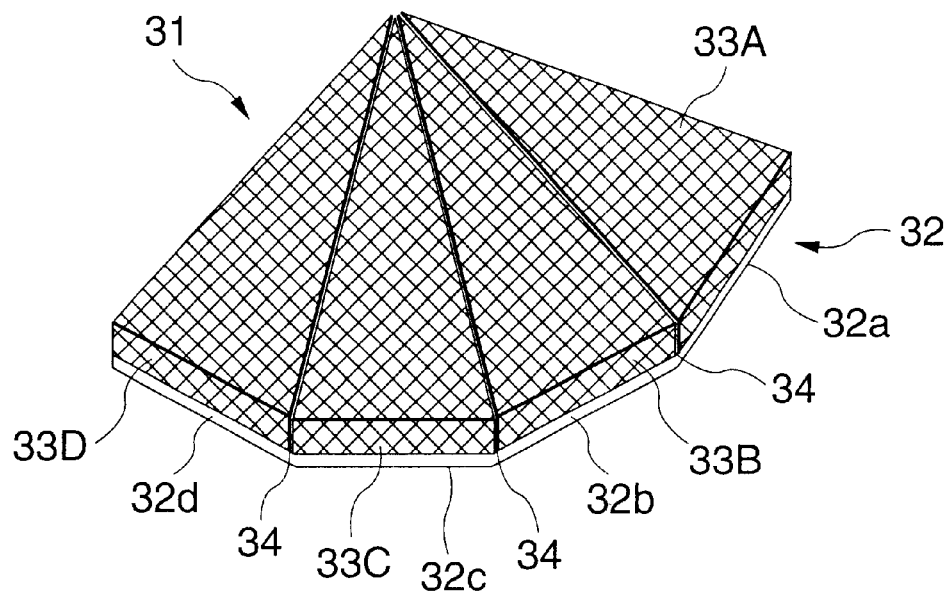
FIGS. 12A and 12B are perspective views showing a radio wave absorber-assembling member and a radio wave absorber produced by use of this member, as a still further embodiment of the present invention.
Figure 12B:
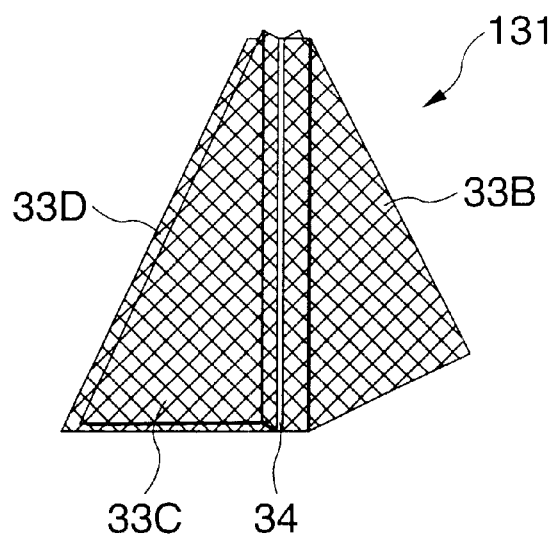

FIGS. 12A and 12B are perspective views showing a radio wave absorber-assembling member and a radio wave absorber produced by use of this member, as a still further embodiment of the present invention. In FIG. 12A, the radio wave absorber-assembling member 31 has an incombustible base material 32, and triangular radio wave-absorbent incombustible materials 33A, 33B, 33C and 33D fixed onto the base material 32. In the base material 32, folding groove portions 34 are provided in boundaries between triangular regions 32a and 32b, 32b and 32c, and 32c and 32d respectively in which the incombustible materials 33A, 33B, 33C and 33D are fixed. A quadrangular pyramid-shaped structure can be assembled by folding the base material 32 at the aforementioned groove portions 34. Incidentally, the quality, thickness, etc. of the base material 32 and those of the incombustible materials 33A, 33B, 33C and 33D can be set in the same manner as in the aforementioned radio wave absorber-assembling member 1 and the description thereof will be omitted.

In this embodiment, the aforementioned radio wave absorber-assembling member 31 is folded at the groove portions 34 (regions in which the radio wave-absorbent incombustible materials 33A, 33B, 33C and 33D are not fixed) of the base material 32 so that there is assembled a quadrangular pyramid-shaped structure having the incombustible materials 33A, 33B, 33C and 33D located outward. Then, an end portion of the region 32a of the base material 32 and an end portion of the region 32d of the base material 32 which are located in a ridgeline portion of the quadrangular pyramid-shaped structure, are bonded to each other so that an radio wave absorber 131 is obtained (FIG. 12B). Any one of the methods shown in FIGS. 5A to 5D may be used for bonding an end portion of the region 32a of the base material 32 to an end portion of the region 32d of the base material 32.

Fifth Embodiment

Figure 13A:
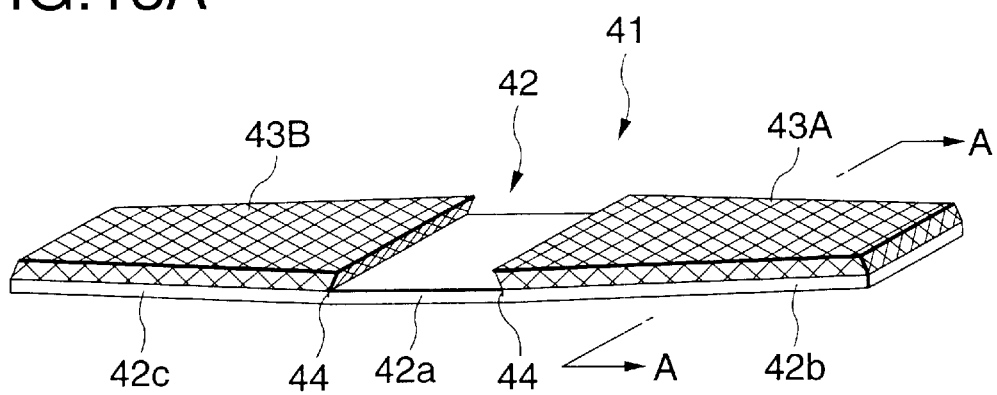
FIGS. 13A to 13C are views showing a radio wave absorber-assembling member and a radio wave absorber produced by use of this member, as another embodiment of the present invention.
Figure 13B:
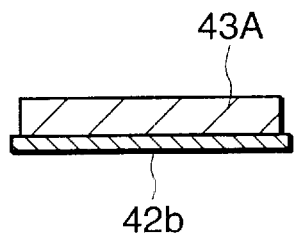
Figure 13C:
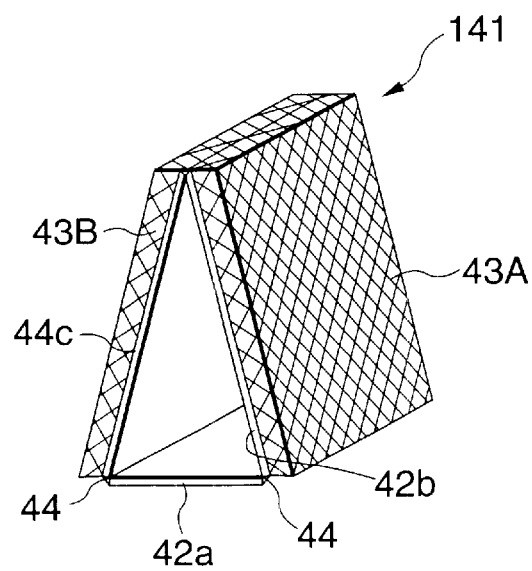

FIGS. 13A, 13B and 13C are views showing a radio wave absorber-assembling member and a radio wave absorber produced by use of this member, as another embodiment of the present invention. In FIG. 13A, the radio wave absorber-assembling member 41 has an incombustible base material 42, and radio wave-absorbent incombustible materials 43A and 43B fixed onto the base material 42. The base material 42 has a region 42a in which no incombustible material is provided, and regions 42b and 42c in which the incombustible materials 43A and 43B are fixed respectively. Folding groove portions 44 are provided in the boundary between the regions 42a and 42b and in the boundary between the regions 42a and 42c respectively. A wedge-shaped structure can be assembled by folding the base material 42 at the aforementioned groove portions 44.

The radio wave absorber-assembling member 41 is substantially the same as the aforementioned radio wave absorber-assembling member 11 except that the radio wave absorber-assembling member 41 has a structure in which not only the widths of the regions 42b and 42c of the base material 42 are tapered toward a top end portion but also the widths of the regions 42b and 42c of the base material 42 are larger than the widths of the incombustible materials 43A and 43B respectively for the purpose of protecting the incombustible materials 43A and 43B. FIG. 13B is a sectional view, taken along the line A—A, of the radio wave absorber-assembling member 41 shown in FIG. 13A. The radio wave absorber-assembling member 41 has a structure in which the region 42b of the base material 42 protrudes from opposite sides of the incombustible material 43A. In this structure, impact from sides is received by the protrusive portions of the base material 42 so that the incombustible materials 43A and 43B are protected.

Incidentally, the quality, thickness, etc. of the base material 42 and those of the incombustible materials 43A and 43B can be set in the same manner as in the aforementioned radio wave absorber-assembling member 1 and the description thereof will be omitted.

In this embodiment, the aforementioned radio wave absorber-assembling member 41 is folded at the groove portions 44 (regions in which the radio wave-absorbent incombustible materials 43A and 43B are not fixed) of the base material 42 so that there is assembled a wedge-shaped structure having the incombustible materials 43A and 43B located outward and having the region 42a of the base material 42 as its base. Then, an end portion of the region 42b of the base material 42 and an end portion of the region 42c of the base material 42 which are located in a top end portion of the wedge-shaped structure, are bonded to each other so that a radio wave absorber 141 is obtained (FIG. 13C). The bonding of an end portion of the region 42b of the base material 42 to an end portion of the region 42c of the base material 42 is not limited specifically but can be performed in the same manner as in the production of the radio wave absorber 111 using the aforementioned radio wave absorber-assembling member 11. The radio wave absorber 141 thus produced has a wedge-shaped structure in which the width of the top end portion is smaller than the width of the base.

Sixth Embodiment

Figure 14A:
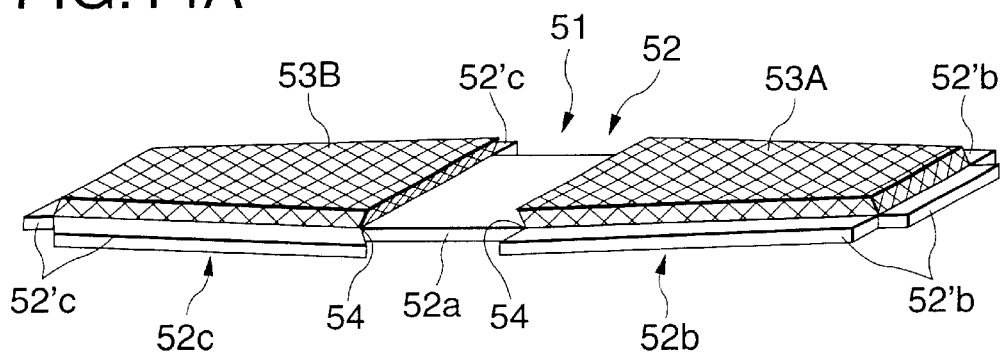
FIGS. 14A to 14D are views showing a radio wave absorber-assembling a radio wave absorber produced by use of this member, as a further embodiment of the present invention.

FIGS. 14A, 14B, 14C and 14D are views showing a radio wave absorber-assembling member and a radio wave absorber produced by use of this member, as a further embodiment of the present invention. In FIG. 14A, the radio wave absorber-assembling member 51 has an incombustible base material 52, and radio wave-absorbent incombustible materials 53A and 53B fixed onto the base material 52. The base material 52 has a region 52a in which no incombustible material is provided, and regions 52b and 52c in which the incombustible materials 53A and 53B are fixed respectively. Folding groove portions 54 are provided in the boundary between the regions 52a and 52b and in the boundary between the regions 52a and 52c respectively. A wedge-shaped structure can be assembled by folding the base material 52 at the aforementioned groove portions 54.

Figure 14B:
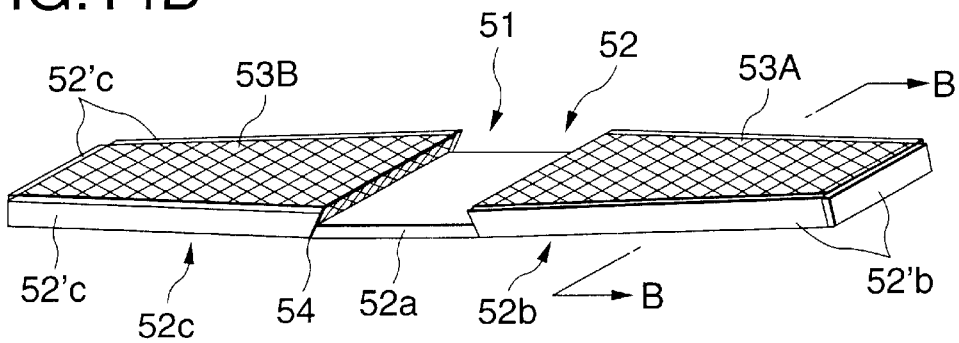
Figure 14C:
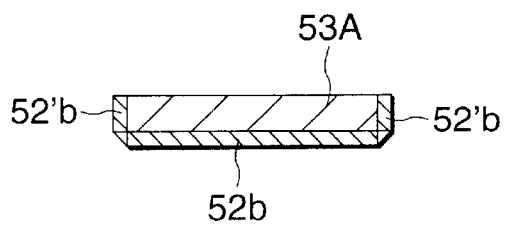

The radio wave absorber-assembling member 51 is substantially the same as the aforementioned radio wave absorber-assembling member 11 except that the radio wave absorber-assembling member 51 is configured so that not only the widths of the regions 52b and 52c of the base material 52 are tapered toward a top end portion but also protective flanges 52'b and 52'c are foldably provided in respective three side end portions of the regions 52b and 52c for the purpose of protecting the incombustible materials 53A and 53B. The protective flanges 52'b and 52'c are folded as shown in FIG. 14B and bonded to sides of the incombustible materials 53A and 53B by an inorganic adhesive agent. FIG. 14C is a sectional view, taken along the line B—B, of the radio wave absorber-assembling member 51 shown in FIG. 14B. The radio wave absorber-assembling member 51 has a structure in which the three sides of the incombustible material 53A fixed onto the region 52b of the base material 52 are protected by the protective flange 52'b. In such a structure, impact from sides is received by the protective flanges 52'b and 52'c so that the incombustible materials 53A and 53B are protected.

Incidentally, the quality, thickness, etc. of the base material 52 and those of the incombustible materials 53A and 53B can be set in the same manner as in the aforementioned radio wave absorber-assembling member 1 and the description thereof will be omitted.

Figure 14D:
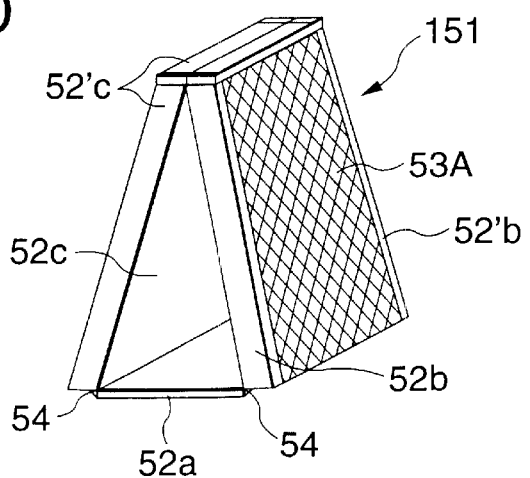

In this embodiment, the aforementioned radio wave absorber-assembling member 51 is folded at the groove portions 54 (regions in which the radio wave-absorbent incombustible materials 53A and 53B are not fixed) of the base material 52 so that there is assembled a wedge-shaped structure having the incombustible materials 53A and 53B located outward and having the region 52a of the base material 52 as its base. Then, an end portion of the region 52b of the base material 52 and an end portion of the region 52c of the base material 52 which are located in a top end portion of the wedge-shaped structure, are bonded to each other so that a radio wave absorber 151 is obtained (FIG. 14D). The bonding of an end portion of the region 52b of the base material 52 to an end portion of the region 52c of the base material 52 is not limited specifically but can be performed in the same manner as in the production of the radio wave absorber 111 using the aforementioned radio wave absorber-assembling member 11. The radio wave absorber 151 thus produced has a wedge-shaped structure in which the width of the top end portion is smaller than the width of the base.

Seventh Embodiment

Figure 15A:
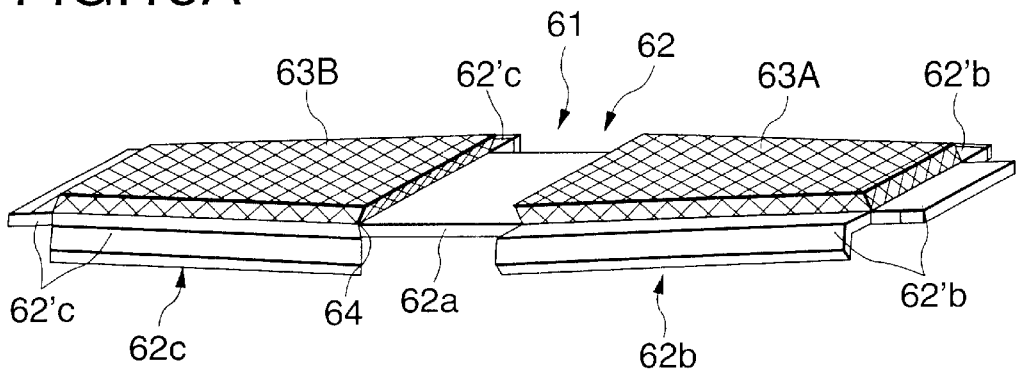
FIGS. 15A to 15D are views showing a radio wave absorber-assembling member and a radio wave absorber produced by use of this member, as a still further embodiment of the present invention.

FIGS. 15A, 15B, 15C and 15D are views showing a radio wave absorber-assembling member and a radio wave absorber produced by use of this member, as a still further embodiment of the present invention. In FIG. 15A, the radio wave absorber-assembling member 61 has an incombustible base material 62, and radio wave-absorbent incombustible materials 63A and 63B fixed onto the base material 62. The base material 62 has a region 62a in which no incombustible material is provided, and regions 62b and 62c in which the incombustible materials 63A and 63B are fixed respectively. Folding groove portions 64 are provided in the boundary between the regions 62a and 62b and in the boundary between the regions 62a and 62c respectively. A wedge-shaped structure can be assembled by folding the base material 62 at the aforementioned groove portions 64.

Figure 15B:
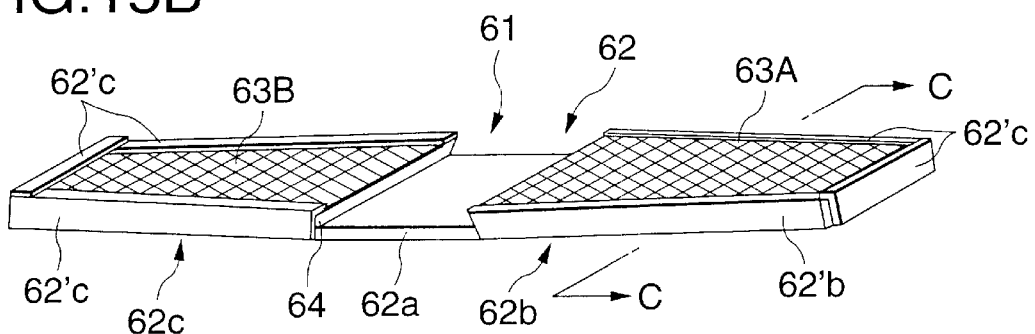
Figure 15C:
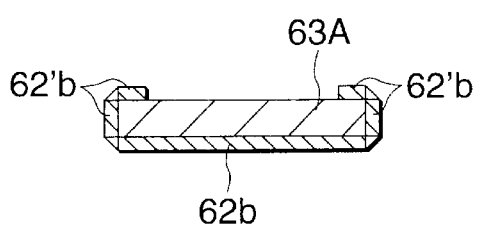

The radio wave absorber-assembling member 61 has protective flanges 62'b and 62'c foldably provided in respective three side end portions of the regions 62b and 62c for the purpose of protecting the incombustible materials 63A and 63B in the same manner as in the aforementioned radio wave absorber-assembling member 51. The radio wave absorber-assembling member 61 is, however, different from the radio wave absorber-assembling member 51 in a point that the protective flanges 62'b and 62'c can be folded in two stages. The protective flanges 62'b and 62'c are folded as shown in FIG. 15B and bonded to sides of the incombustible materials 63A and 63B and to neighbors of end portions of surfaces of the incombustible materials 63A and 63B by an inorganic adhesive agent. FIG. 15C is a sectional view, taken along the line C—C, of the radio wave absorber-assembling member 61 shown in FIG. 15B. The radio wave absorber-assembling member 61 has a structure in which the three sides of the incombustible material 63A fixed onto the region 62b of the base material 62 and the neighbors of end portions of the surface of the incombustible material 63A are protected by the protective flange 62′b. In such a structure, impact is received by the protective flanges 62′b and 62′c so that the incombustible materials 63A and 63B are protected. Particularly, corner portions between sides and surfaces of the incombustible materials 63A and 63B are protected securely.

Incidentally, the quality, thickness, etc. of the base material 62 and those of the incombustible materials 63A and 63B can be set in the same manner as in the aforementioned radio wave absorber-assembling member 1 and the description thereof will be omitted.

Figure 15D:
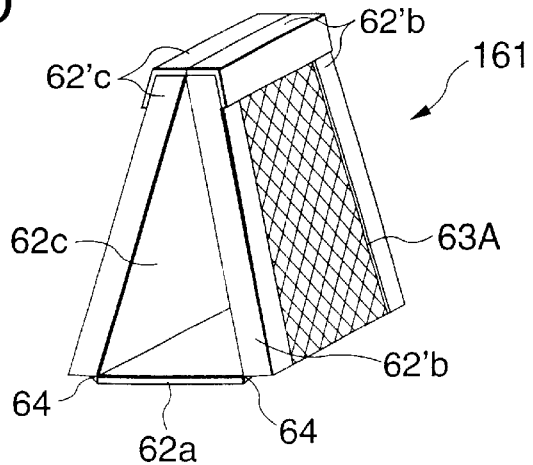

In this embodiment, the aforementioned radio wave absorber-assembling member 61 is folded at the groove portions 64 (regions to which the radio wave-absorbent incombustible materials 63A and 63B are not fixed) of the base material 62 so that there is assembled a wedge-shaped structure having the incombustible materials 63A and 63B located outward and having the region 62a of the base material 62 as its base. Then, an end portion of the region 62b of the base material 62 and an end portion of the region 62c of the base material 62 which are located in a top end portion of the wedge-shaped structure, are bonded to each other so that a radio wave absorber 161 is obtained (FIG. 15D). The bonding of an end portion of the region 62b of the base material 62 to an end portion of the region 62c of the base material 62 is not limited specifically but can be performed in the same manner as in the production of the radio wave absorber 111 using the aforementioned radio wave absorber-assembling member 11.

Eighth Embodiment

Figure 16A:
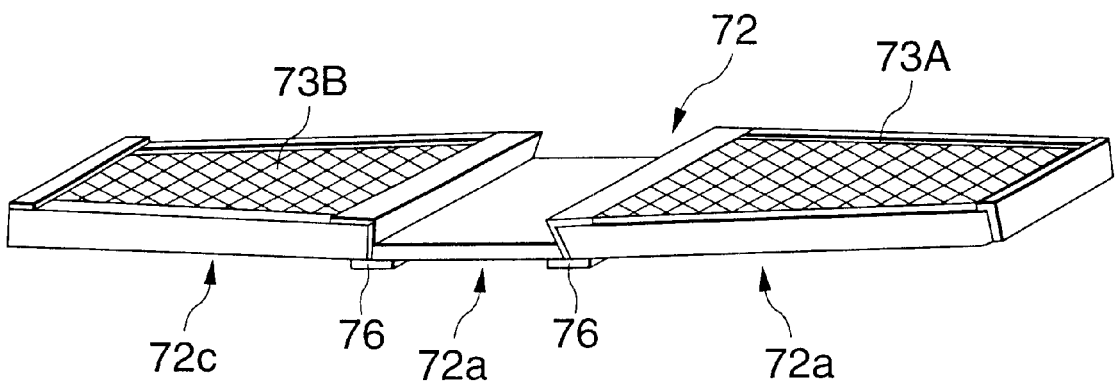
FIGS. 16A and 16B are perspective views showing a radio wave absorber-assembling member and a radio wave absorber produced by use of this member, as another embodiment of the present invention.
Figure 16B:
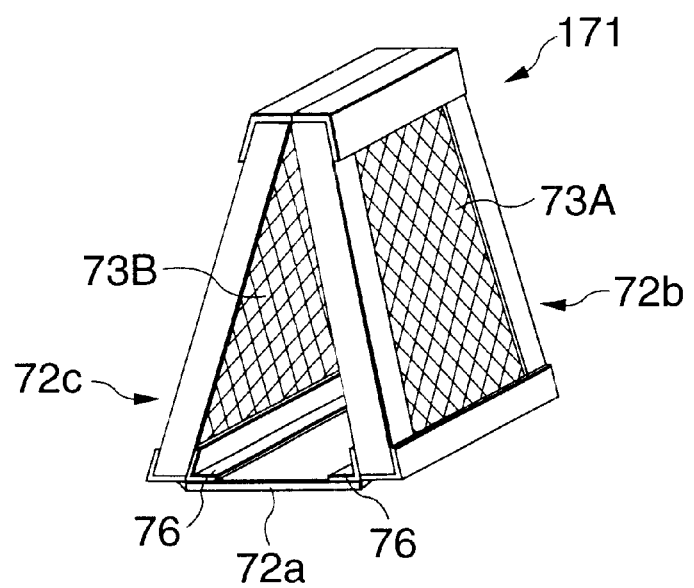

FIGS. 16A and 16B are perspective views showing a radio wave absorber-assembling member and a radio wave absorber produced by use of this member, as another embodiment of the present invention. In FIG. 16A, the radio wave absorber assembling member 71 has an incombustible base material 72, and radio wave-absorbent incombustible materials 73A and 73B fixed onto the base material 72. The base material 72 has a region 72a in which no incombustible material is provided, and regions 72b and 72c in which the incombustible materials 73A and 73B are fixed respectively. The regions 72a and 72b are joined to each other by a foldable joint member 76. The regions 72a and 72c are joined to each other by a foldable joint member 76. A wedge-shaped structure can be assembled from the base material 72 by folding the joint members 76.

Figure 17A:
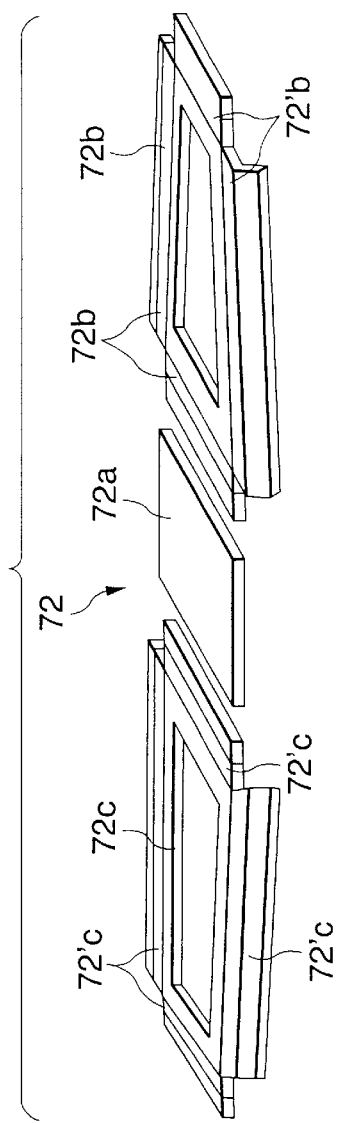
FIGS. 17A to 17C are views for explaining the structure of the radio wave absorber-assembling member shown in FIG. 16A.
Figure 17B:
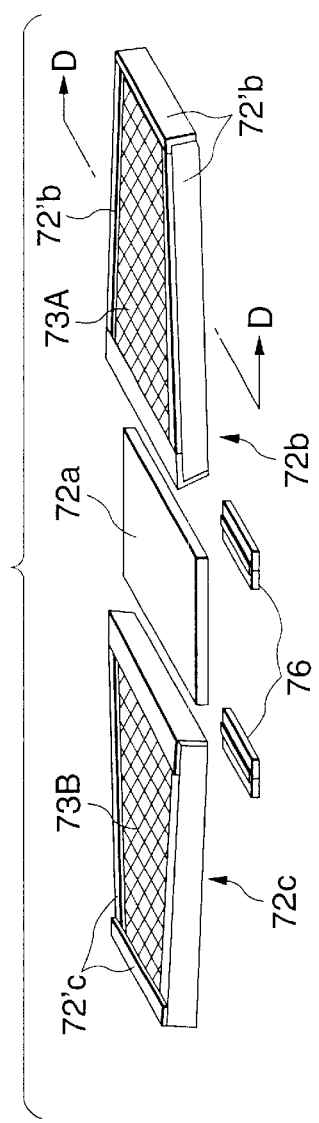
Figure 17C:
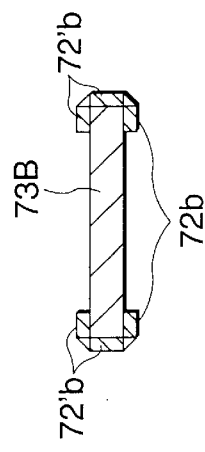

FIGS. 17A, 17B and 17C are views for explaining the structure of the radio wave absorber-assembling member 71 in this embodiment. As shown in FIG. 17A, the incombustible base material 72 is composed of a rectangular base material part 72a, and gallery-shaped base material parts 72b and 72c each having a trapezoidal opening. Protective flanges 72′b and 72′c are provided in the surroundings of the gallery-shaped base material parts 72b and 72c respectively so as to be foldable in two stages. The incombustible materials 73A and 73B are fixed onto the gallery-shaped base material parts 72b and 72c respectively. The protective flanges 72′b and 72′c are folded as shown in FIG. 17B and bonded to sides of the incombustible materials 73A and 73B and to neighbors of end portions of surfaces of the incombustible materials 73A and 73B by an inorganic adhesive agent. FIG. 17C is a sectional view taken along the line D—D shown in FIG. 17B. The radio wave absorber-assembling member 71 has a structure in which the four sides of the incombustible material 73A fixed onto the base material part 72b and the neighbors of end portions of the surface of the incombustible material 73A are protected by the protective flange 72′b. Further, the base material parts 72b and 72c are joined to the base material part 72a through the joint members 76 so that a connected body as a radio wave absorber assembling member 71 is formed.

Incidentally, the quality, thickness, etc. of the base material 72 (72a, 72b and 72c) and those of the incombustible materials 73A and 73B can be set in the same manner as in the aforementioned radio wave absorber-assembling member 1 and the description thereof will be omitted.

In this embodiment, the aforementioned radio wave absorber-assembling member 71 is folded with the joint members 76 turning inward so that there is assembled a wedge-shaped structure having the base material part (region) 72a of the base material 72 as its base. Then, an end portion of the base material part (region) 72b of the base material 72 and an end portion of the base material part (region) 72c of the base material 72 which are located in a top end portion of the wedge-shaped structure, are bonded to each other so that a radio wave absorber 171 is obtained (FIG. 16B). The bonding of an end portion of the base material part (region) 72b of the base material 72 to an end portion of the base material part (region) 72c of the base material 72 is not limited specifically but can be performed in the same manner as in the production of the radio wave absorber 111 using the aforementioned radio wave absorber-assembling member 11.

Ninth Embodiment

The aforementioned radio wave absorber-assembling member 71 is configured so that the base material part (region) 72b to which the incombustible material 73A is fixed and the base material part (region) 72c to which the incombustible material 73B is fixed are joined to each other by the foldable joint members 76 through the base material part 72a to which no incombustible material is fixed. Alternatively, the radio wave absorber-assembling member according to the present invention may be configured so that the base material part 72b to which the incombustible material 73A is fixed and the base material part 72c to which the incombustible material 73B is fixed are joined to each other by the foldable joint members 76 directly. FIGS. 18A and 18B are perspective views showing such a radio wave absorber-assembling member and a radio wave absorber produced by use of this member, as a further embodiment of the present invention. In FIG. 18A, the radio wave absorber-assembling member 81 is produced as follows. Two combinations are produced so that each of the two combinations is formed by joining a base material part 72b having a incombustible material 73A fixed thereto and a base material part 72c having an incombustible material 73B fixed thereto to each other by a foldable joint member 76a at narrower one of end portions. The base material part 72b having the incombustible material 73A fixed thereto in one combination and the base material part 72c having the incombustible material 73B fixed thereto in the other combination are joined to each other by a foldable joint member 76b. The surface to be joined with the joint member 76b is opposite to the surfaces to be joined with the joint members 76a.

In this embodiment, the aforementioned radio wave absorber-assembling member 81 is folded with the joint members 76a turning inward and further folded with the joint member 76b turning inward. As a result, wedge-shaped structures are assembled side by side so that a radio wave absorber 181 is obtained (FIG. 18B).

As described above in detail, according to the present invention, the radio wave absorber-assembling member is not bulky because it has a flat shape. Accordingly, it is very easy to carry the radio wave absorber-assembling member in construction of a radio wave anechoic room. Further, a desired structure is produced as a radio wave absorber by folding the radio wave absorber-assembling member without pre-treatment. Accordingly, working efficiency is very good. The radio wave absorber thus produced has incombustible characteristic.

What is claimed is:

1. A member for assembling a radio wave absorber, comprising:
    an incombustible base material capable of assembling a predetermined-shape structure; and
    radio wave absorbent incombustible materials fixed to predetermined regions of said base material,
    wherein each of said incombustible materials is constituted by a honey-comb structure which is formed by laminating incombustible sheets into a honey-comb shape by use of an inorganic adhesive agent.

2. A member for assembling a radio wave absorber according to claim 1, wherein said base material has folding groove portions in regions in which the incombustible materials are not fixed.

3. A member for assembling a radio wave absorber according to claim 1, wherein said base material is constituted by a connected body which is formed by joining a plurality of base material parts to one another by foldable joint members in regions in which said incombustible materials are not fixed.

4. A member for assembling a radio wave absorber according to claim 1, wherein each of said incombustible materials has a surface constituted by an electrically conductive layer containing an electrically conductive material.

5. A method of producing a radio wave absorber, comprising the steps of:
    processing an incombustible base material into a shape capable of assembling a desired-shape structure;
    laminating incombustible sheets using an inorganic agent to form radio wave-absorbent incombustible materials each having a honey-comb shape;
    fixing radio wave-absorbent incombustible materials to predetermined regions of said base material to thereby produce a member for assembling a radio wave absorber; and
    bonding end portions of said base material to each other while folding said base material in regions in which said incombustible materials are not fixed.

6. A method of producing a radio wave absorber according to claim 5, wherein the shape of said radio wave absorber is any one of shapes including a quadrangular pyramid shape, a triangular prism shape, and a wedge shape.

7. A method of producing a radio wave absorber according to any one of claim 6, wherein folding groove portions are formed in regions of said base material free from said incombustible materials in advance so that said base material is folded in said groove portions.

8. A method of producing a radio wave absorber, comprising the steps of:
    laminating incombustible sheets using an inorganic agent to form radio wave-absorbent incombustible materials each having a honey-comb shape;
    forming a plurality of parts each by fixing a radio wave absorbent incombustible material to a predetermined region of a incombustible base material processed into a desired shape;
    joining said parts to one another by foldable joint members directly or through an incombustible base material free from incombustible materials to thereby produce a member for assembling a radio wave absorber; and
    bonding end portions of said base material to each other while folding said joint members.

9. A method of producing a radio wave absorber according to claim 8, wherein the shape of said radio wave absorber is any one of shapes including a quadrangular pyramid shape, a triangular prism shape, and a wedge shape.

10. A method of producing a radio wave absorber according to claims 8, wherein folding groove portions are formed in regions of said base material free from said incombustible materials in advance so that said base material is folded in said groove portions.

11. A method of producing a radio wave absorber, comprising the steps of:
    making incombustible sheets from a slurry containing a water-containing inorganic compound and an electrically conductive material;
    laminating said incombustible sheets using an inorganic agent to form radio wave-absorbent incombustible materials each having a honey-comb shape;
    forming a plurality of parts each by fixing a radio wave absorbent incombustible material to a predetermined region of a incombustible base material processed into a desired shape;
    joining said parts to one another by foldable joint members directly or through an incombustible base material free from incombustible materials to thereby produce a member for assembling a radio wave absorber; and
    bonding end portions of said base material to each other while folding said joint members.

12. A method of producing a radio wave absorber according to claim 11 wherein the shape of said radio wave absorber is any one of shapes including a quadrangular pyramid shape, a triangular prism shape, and a wedge shape.

13. A method of producing a radio wave absorber according to claim 11, wherein folding groove portions are formed in regions of said base material free from said incombustible materials in advance so that said base material is folded in said groove portions.

14. A member for assembling a radio wave absorber, comprising:
    an incombustible base material capable of assembling a predetermined-shape structure; and
    radio wave absorbent incombustible materials fixed to predetermined regions of said base material,
    wherein each of said incombustible materials is constituted by a honey-comb structure which is formed by laminating incombustible sheets into a honey-comb shape by use of an inorganic adhesive agent, and
    wherein said incombustible sheets are made from a slurry containing a water-containing inorganic compound and an electrically conductive material.

15. A member for assembling a radio wave absorber according to claim 14, wherein said base material has folding groove portions in regions in which the incombustible materials are not fixed.

16. A member for assembling a radio wave absorber according to claim 14, wherein said base material is constituted by a connected body which is formed by joining a plurality of base material parts to one another by foldable joint members in regions in which said incombustible materials are not fixed.

17. A member for assembling a radio wave absorber according to claim 14, wherein each of said incombustible materials has a surface constituted by an electrically conductive layer containing an electrically conductive material.

18. A method of producing a radio wave absorber, comprising the steps of:
- processing an incombustible base material into a shape capable of assembling a desired-shape structure;
- making incombustible sheets from a slurry containing a water-containing inorganic compound and an electrically conductive material;
- laminating said incombustible sheets using an inorganic agent to form radio wave-absorbent incombustible materials each having a honey-comb shape;
- fixing radio wave-absorbent incombustible materials to predetermined regions of said base material to thereby produce a member for assembling a radio wave absorber; and
- bonding end portions of said base material to each other while folding said base material in regions in which said incombustible materials are not fixed.

19. A method of producing a radio wave absorber according to claim 18, wherein the shape of said radio wave absorber is any one of shapes including a quadrangular pyramid shape, a triangular prism shape, and a wedge shape.

20. A method of producing a radio wave absorber according to claim 18, wherein folding groove portions are formed in regions of said base material free from said incombustible materials in advance so that said base material is folded in said groove portions.

* * * * *